United States Patent [19]

Chiou

[11] Patent Number: 6,025,994
[45] Date of Patent: Feb. 15, 2000

[54] HEAT SINK FASTENER

[76] Inventor: Ming Horng Chiou, 4F., No. 36. Yu Min Rd., Tu Cheng City, Taipei Hsien, Taiwan

[21] Appl. No.: 09/106,280

[22] Filed: Jun. 29, 1998

[51] Int. Cl.$^7$ ..................................................... H05K 7/20
[52] U.S. Cl. ............................ 361/715; 24/458; 165/185; 248/510; 257/727
[58] Field of Search .............................. 24/457, 458, 625; 361/687, 703, 704, 715, 717–719; 257/718, 719, 727; 174/16.3; 165/80.3, 185; 267/150, 158, 160; 248/316.7, 510

[56] References Cited

U.S. PATENT DOCUMENTS 5,805,419  9/1998  Hundt .
5,828,553  10/1998  Chiou .
5,903,434  5/1999  Chiou .
5,933,326  8/1999  Lee .

*Primary Examiner*—Gerald Tolin
*Attorney, Agent, or Firm*—Bacon & Thomas, PLLC

[57] ABSTRACT

A heat sink fastener includes an elongated clamping plate attached to a heat sink and having two clamping arms at two opposite ends respectively hooked in respective hook holes on a CPU module to secure the heat sink to the CPU module, and a holding down plate coupled to the clamping plate to hold down the clamping arms, the holding down plate having a longitudinal locating hole coupled to the clamping arms of the clamping plate to hold down the clamping arms in the respective hook hole on the CPU module, and a finger strip for pulling by hand to disengage the holding down plate from the clamping arms of the clamping plate.

3 Claims, 5 Drawing Sheets

HEAT SINK FASTENER

BACKGROUND OF THE INVENTION

The present invention relates to a heat sink fastener for securing a heat sink to a CPU module, and more particularly to such a heat sink fastener which can be quickly installed to secure a heat sink to a CPU module, and conveniently disconnected from the heat sink and the CPU module when desired.

Various heat sink fastening devices have been disclosed for use to secure a heat sink to a CPU module. These heat sink fastening devices commonly use a locking lever for locking/unlocking control. However, the locking lever tends to be forced out of position when vibrated causing the heat sink fastening device to fall from the heat sink and the CPU module.

SUMMARY OF THE INVENTION

The present invention provides a heat sink fastener which eliminates the aforesaid problem. According to one aspect of the invention, the heat sink fastener comprises an elongated clamping plate attached to a heat sink and having two clamping arms at two opposite ends respectively hooked in respective hook holes on a CPU module to secure the heat sink to the CPU module, and a holding down plate coupled to the clamping plate to hold down the clamping arms, the holding down plate having a longitudinal locating hole coupled to the clamping arms of the clamping plate to hold down the clamping arms in the respective hook hole on the CPU module, and a finger strip for pulling by hand to disengage the holding down plate from the clamping arms of the clamping plate. According to another aspect of the present invention, clamping plate has reinforcing ribs raised from two opposite long sides of a flat middle base between the clamping arms to reinforce the structural strength against deformation.

DETAILED DESCRIPTION OF THE PREFERRED EMBODIMENT

Figure 1:
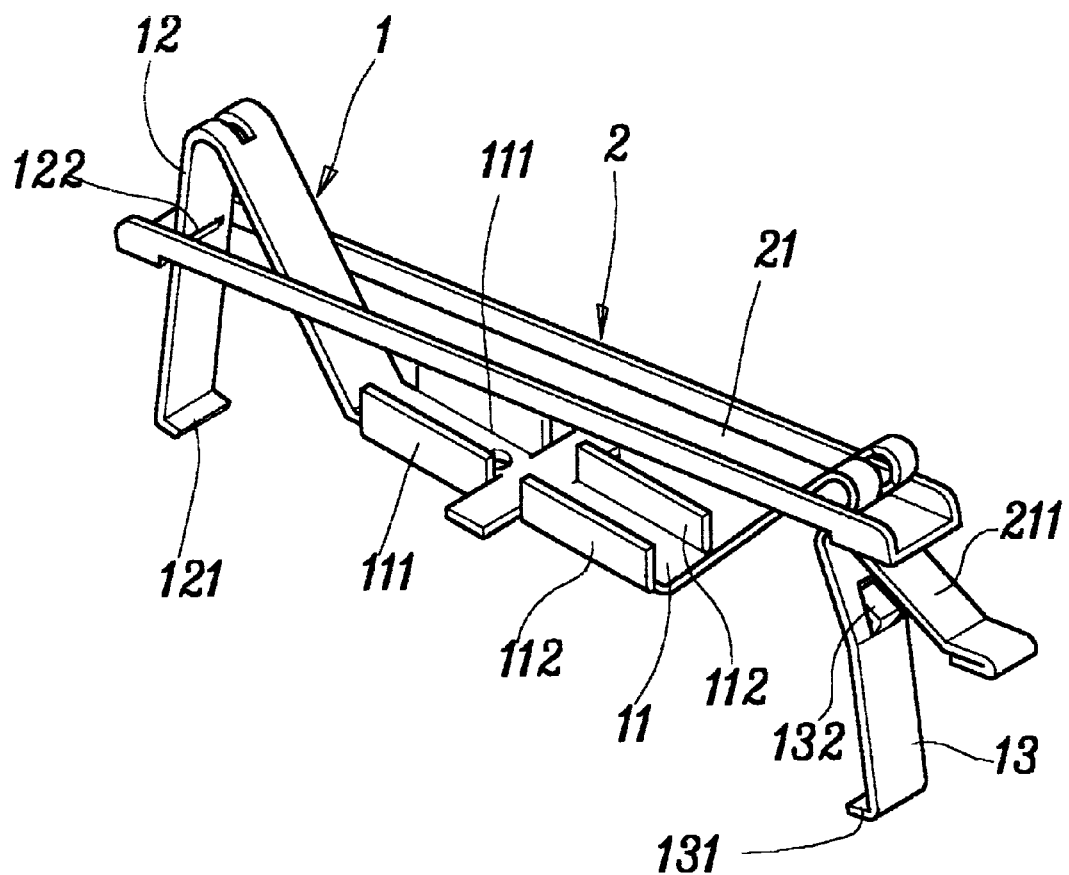
FIG. 1 is a perspective view of a heat sink fastener according to the present invention.
Figure 2:
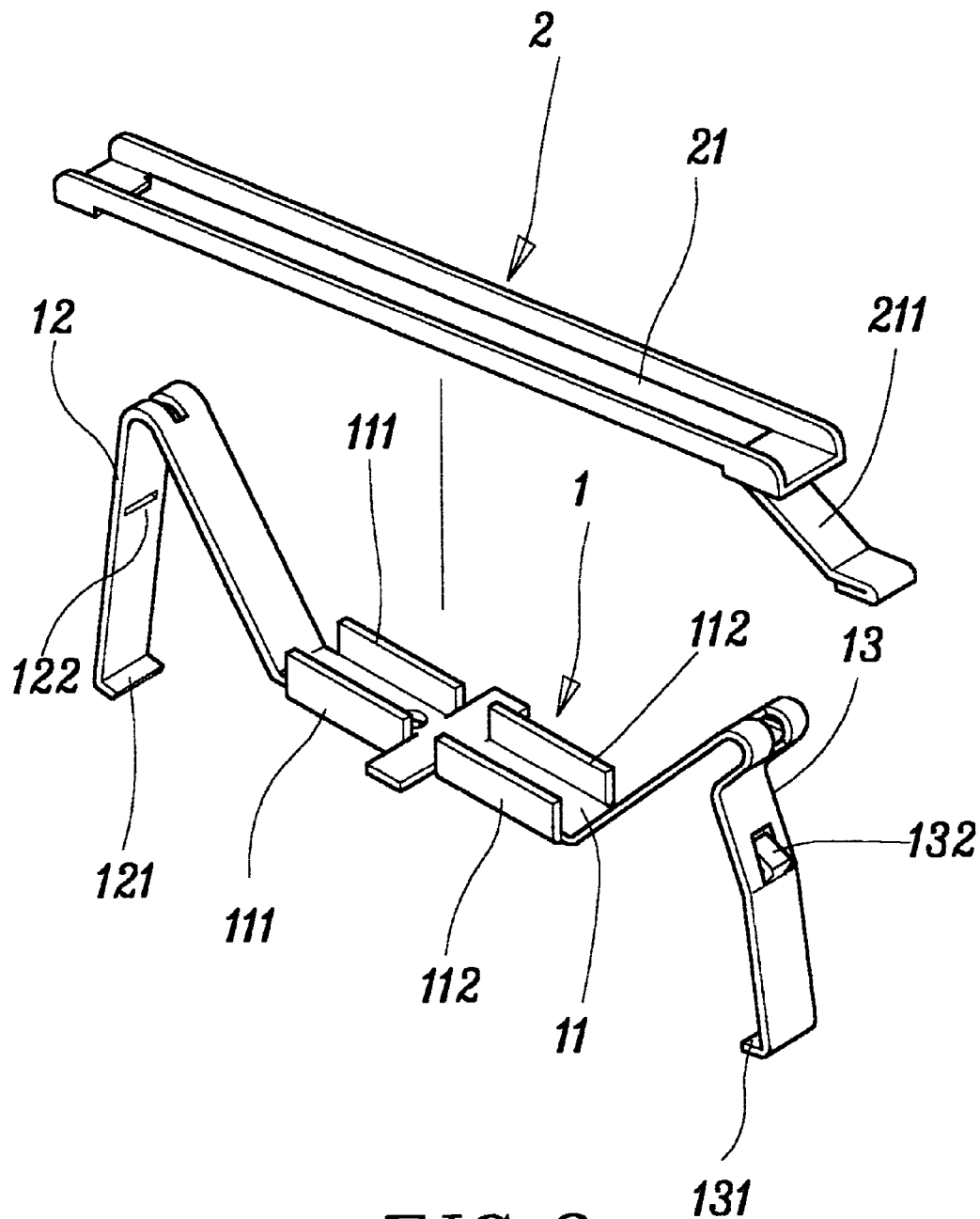
FIG. 2 is an exploded view of the heat sink fastener shown in FIG. 1.

Referring to FIGS. 1 and 2, a heat sink fastener in accordance with the present invention is generally comprised of a clamping plate 1, and a holding down plate 2.

The clamping plate 1 comprises an elongated flat base 11, a first clamping arm 12 and a second clamping arm 13 respectively extended from two opposite ends of the flat base 11, a horizontal slot 122 at the first clamping arm 12, a springy projecting hook 132 integral with the second clamping arm 13, a first hooked portion 121 at one end of the first clamping arm 12 remote from the flat base 11, and a second hooked portion 131 at one end of the second clamping arm 13 remote from the flat base 11. The holding down plate 2 comprises a longitudinal locating hole 21, and a finger strip 211 at one end. Further, reinforcing ribs 111;112 are raised from the flat base 11 of the clamping plate 1 along two opposite long sides thereof. The reinforcing ribs 11;112 reinforce the structural strength of the flat base 11 against deformation.

Figure 3:
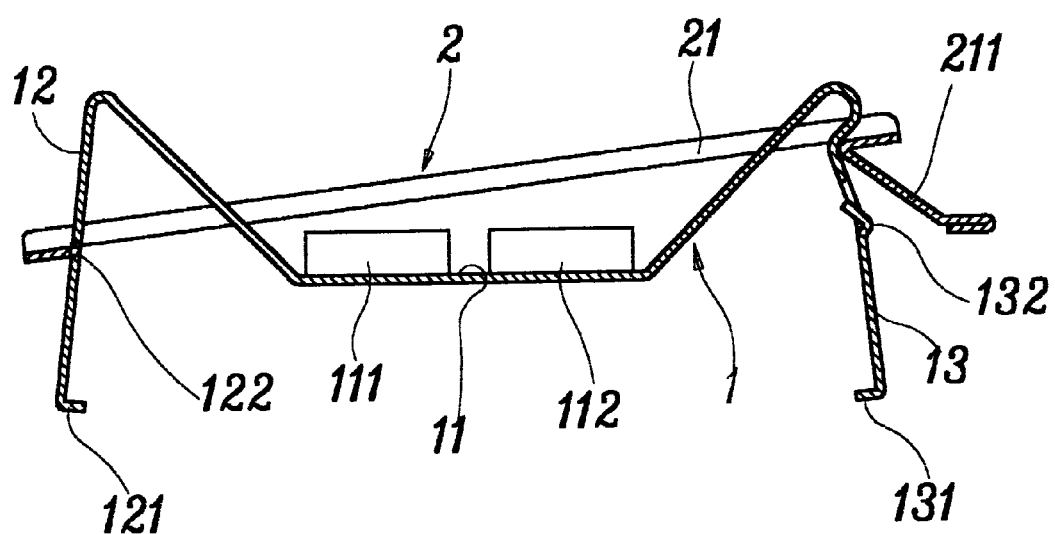
FIG. 3 is a sectional view of the present invention, showing one end edge of the longitudinal locating hole of the holding down plate engaged with the horizontal slot on the first clamping arm of the clamping plate, the other end edge of the longitudinal locating hole of the holding down plate disengaged from the springy projecting hook at the second clamping arm of the clamping plate.

Referring to FIG. 3, when the curved middle portions of the clamping arms 12;13 of the clamping plate 1 are inserted into the longitudinal locating hole 21 on the holding down plate 2, the horizontal slot 122 of the first clamping arm 12 of the clamping plate 1 is forced into engagement with an end edge of the longitudinal locating hole 21 of the holding down plate 2, and then the finger strip 211 is pulled downwards with the hand, enabling the other end edge of the longitudinal locating hole 21 of the holding down plate 2 to be moved over the springy projecting hook 132 and forced into engagement with the bottom edge of the springy projecting hook 132.

Figure 4:
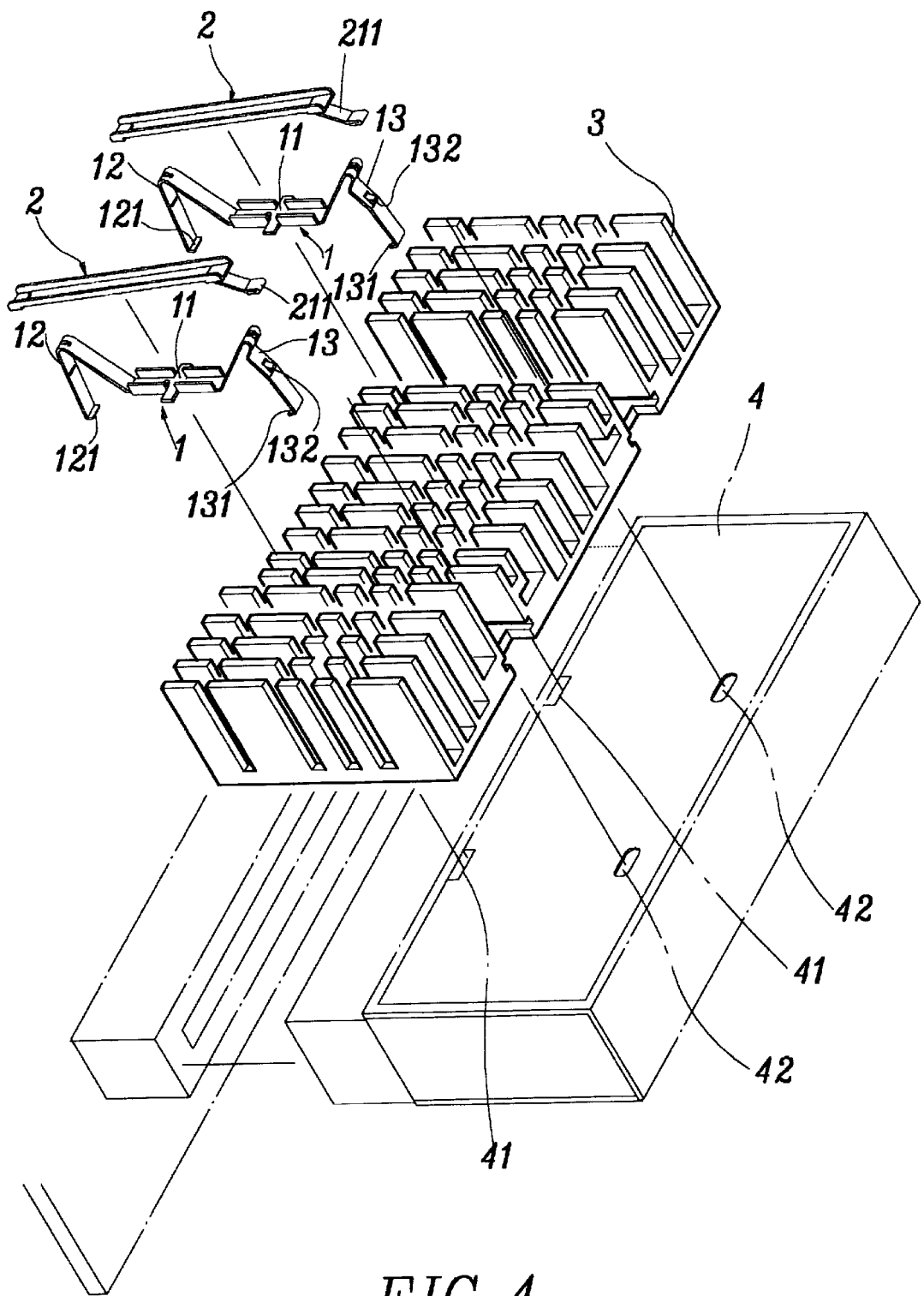
FIG. 4 shows an application example of the present invention.
Figure 5:
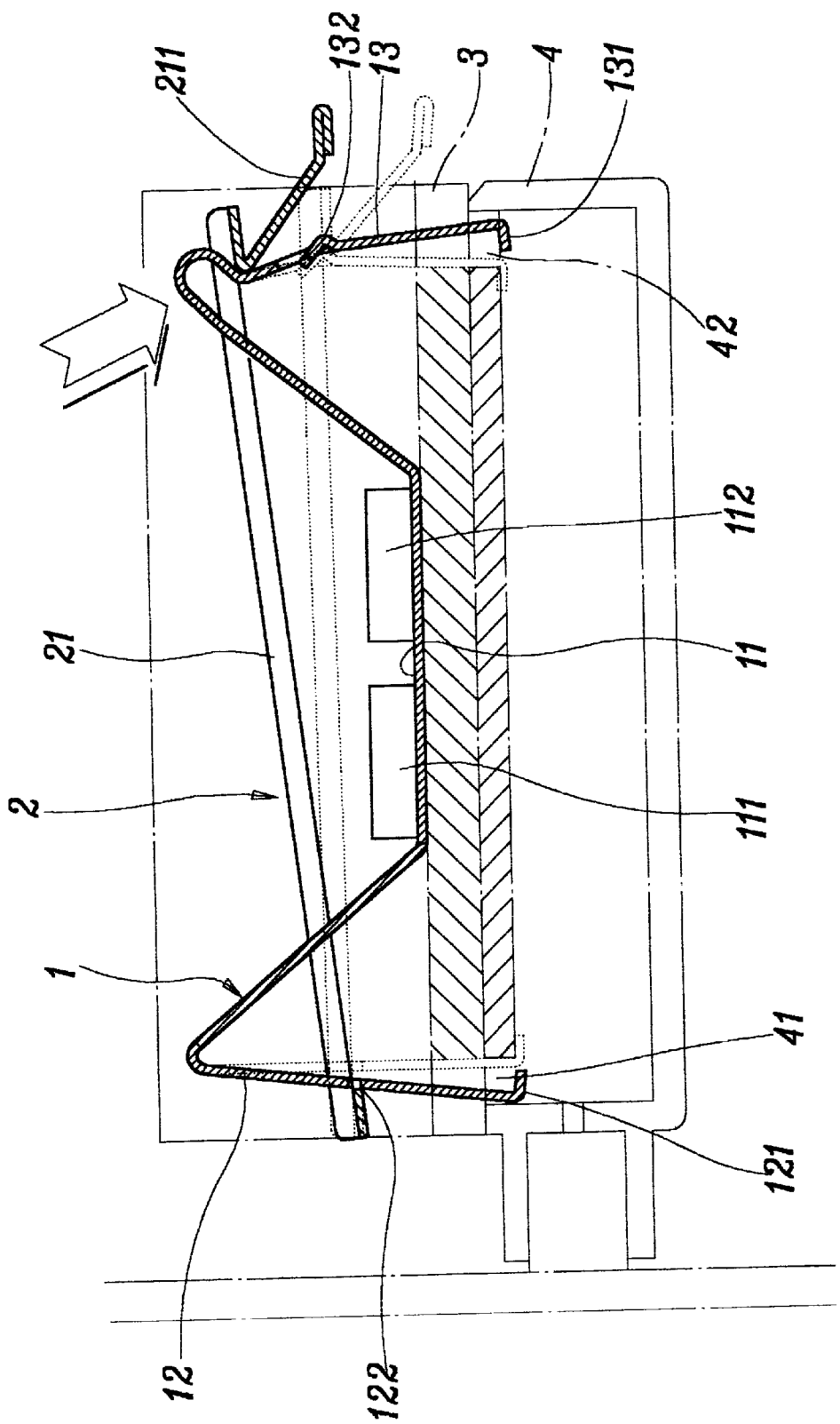
FIG. 5 is a sectional view showing the clamping plate fastened to the heat sink and the CPU module, the holding down plate coupled to the clamping plate.

Referring to FIGS. 4 and 5, when a heat sink 3 is attached to a CPU module 4, the flat base 11 of the clamping plate 1 is attached to the heat sink 3, and the hooked portions 121;131 of the clamping arms 12;13 of the clamping plate 1 are hooked in respective hook holes 42 on the CPU module 4, and then the holding down plate 2 is coupled to the clamping plate 1 to secure the clamping plate 1 in place. When the two opposite end edges of the longitudinal locating hole 21 of the holding down plate 2 are respectively forced into engagement with the horizontal slot 122 on the first clamping arm 12 and the springy projecting hook 132 at the second clamping arm 13, the clamping arms 12;13 are forced inwards toward each other, and therefore the hooked portions 121;131 are firmly retained in engagement with the respective hook holes 42 on the CPU module 4.

While only one embodiment of the present invention has been shown and described, it will be understood that various modifications and changes could be made thereunto without departing from the spirit and scope of the invention disclosed.

What the invention claimed is:

1. A heat sink fastener comprising:

a clamping plate fastened to a CPU module to hold down a heat sink, said clamping plate comprising an elongated flat base attached to the heat sink, a first clamping arm and a second clamping arm respectively extended from two opposite ends of said flat base, a horizontal slot at said first clamping arm, a springy projecting hook integral with said second clamping arm, a first hooked portion and a second hooked portion respectively integral with said first clamping arm and said second clamping arm at one end remote from said flat base and respectively hooked in a respective hook hole on the CPU module, said first clamping arm and said second clamping arm each having a Curved middle portion disposed at an elevation above said flat base; and a holding down plate coupled to said clamping plate to hold down the clamping arms of said clamping plate, said holding down plate having a longitudinal locating hole coupled to said clamping arms of said clamping plate above said flat base, said longitudinal locating hole having a first end edge at one end for engagement with the horizontal slot at said first clamping arm of said clamping plate and a second end edge at an opposite end for engagement with said springy projecting hook of said clamping plate, and a finger strip at one end for pulling by hand to disengage the second end edge of said longitudinal locating hole from said spring projecting hook of said clamping plate.

2. The heat sink fastener of claim 1 wherein the middle portion of said second clamping arm is curved inwards toward said flat base, then extended outwardly downwards toward said second hooked portion.

3. The heat sink fastener of claim 1 wherein said clamping plate comprises a plurality of reinforcing ribs raised along two opposite long sides of said flat base.

* * * * *